(12) United States Patent
Ma et al.

(10) Patent No.: US 7,782,109 B2
(45) Date of Patent: Aug. 24, 2010

(54) DELAY CIRCUIT AND RELATED METHOD

(75) Inventors: Chang-Po Ma, Hsinchu (TW); Yuan-Chin Liu, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 358 days.

(21) Appl. No.: 12/110,368

(22) Filed: Apr. 28, 2008

(65) Prior Publication Data

US 2009/0278549 A1  Nov. 12, 2009

Related U.S. Application Data

(63) Continuation-in-part of application No. 11/763,454, filed on Jun. 15, 2007, now abandoned.

(51) Int. Cl.
*H03H 11/26* (2006.01)
(52) U.S. Cl. ........................ 327/276; 327/233
(58) Field of Classification Search .................. None
See application file for complete search history.

(56) References Cited

U.S. PATENT DOCUMENTS

| | | | |
|---|---|---|---|
| 5,734,283 A * | 3/1998 | Hedberg | 327/277 |
| 6,510,191 B2 | 1/2003 | Bockelman | |
| 6,580,301 B2 | 6/2003 | Moshe | |
| 6,590,434 B2 | 7/2003 | Chung | |
| 6,720,811 B2 | 4/2004 | Yazawa | |
| 6,930,525 B2 | 8/2005 | Lin | |
| 7,332,950 B2 | 2/2008 | Blodgett | |
| 2008/0122471 A1 * | 5/2008 | Yamanaka | 324/763 |

FOREIGN PATENT DOCUMENTS

CN  1433148 A  7/2003

* cited by examiner

*Primary Examiner*—An T Luu
(74) *Attorney, Agent, or Firm*—Winston Hsu

(57) ABSTRACT

A delay circuit includes a first delay module, a delay measurement unit and a fault judge unit. The first delay module has a first delay circuit with at least one delay stage. The delay measurement unit is used for measuring a first delay amount and a second delay amount of the first delay chain respectively corresponding to a first number and a second number of delay stages. The fault judge unit is used for determining if the first delay chain has delay faults or not according to the first and second delay amounts.

24 Claims, 16 Drawing Sheets

US 7,782,109 B2

DELAY CIRCUIT AND RELATED METHOD

CROSS REFERENCE TO RELATED APPLICATIONS

This application is a continuation-in-part application and claims the benefit of U.S. application Ser. No. 11/763,454 entitled "DELAY CIRCUIT AND RELATED METHOD THEREOF", which was filed on Jun. 15, 2007.

BACKGROUND OF THE INVENTION

The present invention relates to a delay circuit and method thereof, and particularly relates to a delay circuit that can detect if the delay stages have delay faults or not, and a related method.

FIG. 1 illustrates a circuit diagram of a related art delay circuit 100. The delay circuit 100 includes a plurality of delay stages 101, 103, 105 . . . 10n (only part of the delay stages are illustrated), and utilizes a selection signal SS to select a number of delay stages to delay the input data signal $Data_{in}$ by a desired delay amount in order to generate a desired output data signal $Data_{out}$. One or more of the delay stages may have a delay fault, however, causing erroneous generation of the output data signal. Therefore, detection methods to detect if a delay circuit has delay faults or not are developed.

One example of a detection method is inputting an input clock signal to a path having a specific number of delay stages of a delay circuit and checking if the output clock signal changes corresponding to the value of the input clock signal. If yes, the delay circuit is fine, if not, at least one delay stage on the path has a delay fault, thus the delay circuit should be abandoned.

There may be a delay time between the changing of the input clock value to the output clock signal. Such a delay time is acceptable if it is smaller than a specific value, so another detection method inputs two clock signals having a minor time difference to a path having a specific number of delay stages of a delay circuit and checking if the output signal changes in the acceptable delay time. If yes, the delay circuit is fine, if not, at least one delay stage on the path has a delay fault, and the delay circuit should therefore be abandoned.

Such a mechanism has various disadvantages, however. For example, if there is a delay time between the changing of the input clock value to the output clock signal, a flip flop is needed to detect if the delay circuit has a delay fault or not, but a delay circuit does not initially include a flip flop. Additionally, a delay stage may have an acceptable delay amount variance, but the delay amount variance may affect the determination result, since it is difficult to distinguish whether said delay amount variance is the acceptable delay amount or the unacceptable time delay.

SUMMARY OF THE INVENTION

Therefore, one objective of the present invention is to provide a delay circuit, which can detect if a delay chain thereof has delay faults or not.

Another objective of the present invention is to provide a delay circuit having a plurality of delay chains, wherein the delay circuit can detect whether each of the delay chains has a delay fault or not.

One embodiment of the present invention discloses a delay circuit, which comprises: a first delay module, having a first delay circuit with at least one delay stage; a delay measurement unit, coupled to the first delay module, for measuring a first delay amount and a second delay amount of the first delay chain corresponding to a first number and a second number of delay stages respectively; and a fault judge unit, coupled to the delay measurement unit, for determining if the first delay chain has a delay fault or not according to the first and second delay amounts. A method corresponding to this delay circuit can be obtained accordingly, and is therefore omitted here for brevity.

Another embodiment of the present invention discloses a delay circuit, which comprises: a first delay module, having a first delay circuit with at least one delay stage; a second delay module, having a second delay circuit with at least one delay stage; a delay measurement unit, coupled to the first and the second delay modules, for measuring a first delay amount of the first delay chain and a second delay amount of the second delay chain; and a fault judge unit, coupled to the delay measurement unit, for determining if the first delay chain or the second delay chain has delay faults or not according to the first and second delay amounts. A method corresponding to this delay circuit can be obtained accordingly, and is therefore omitted here for brevity.

According to the above-mentioned circuits, problems of the related art can be avoided. Also, the delay circuit according to the present invention can be utilized as a normal delay circuit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 illustrates a circuit diagram of the detailed structure of the delay mapping unit shown in FIG. 2a.

FIG. 5 illustrates a circuit diagram of the map delay module shown in FIG. 2a.

FIG. 6 is a block diagram illustrating detailed structures of the delay measurement unit shown in FIG. 2a.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
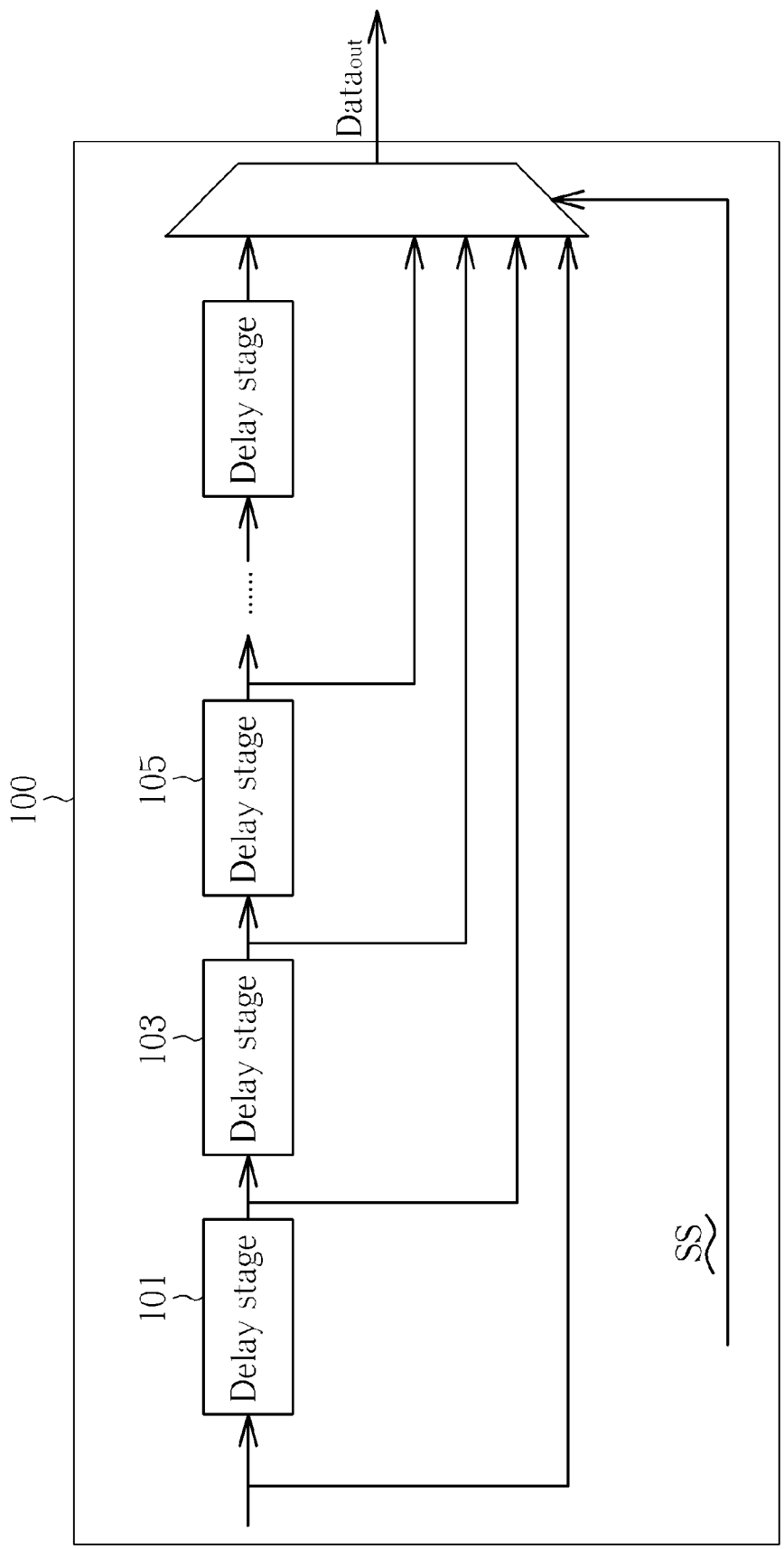
FIG. 1 illustrates a circuit diagram of a related art delay circuit.
Figure 2A:
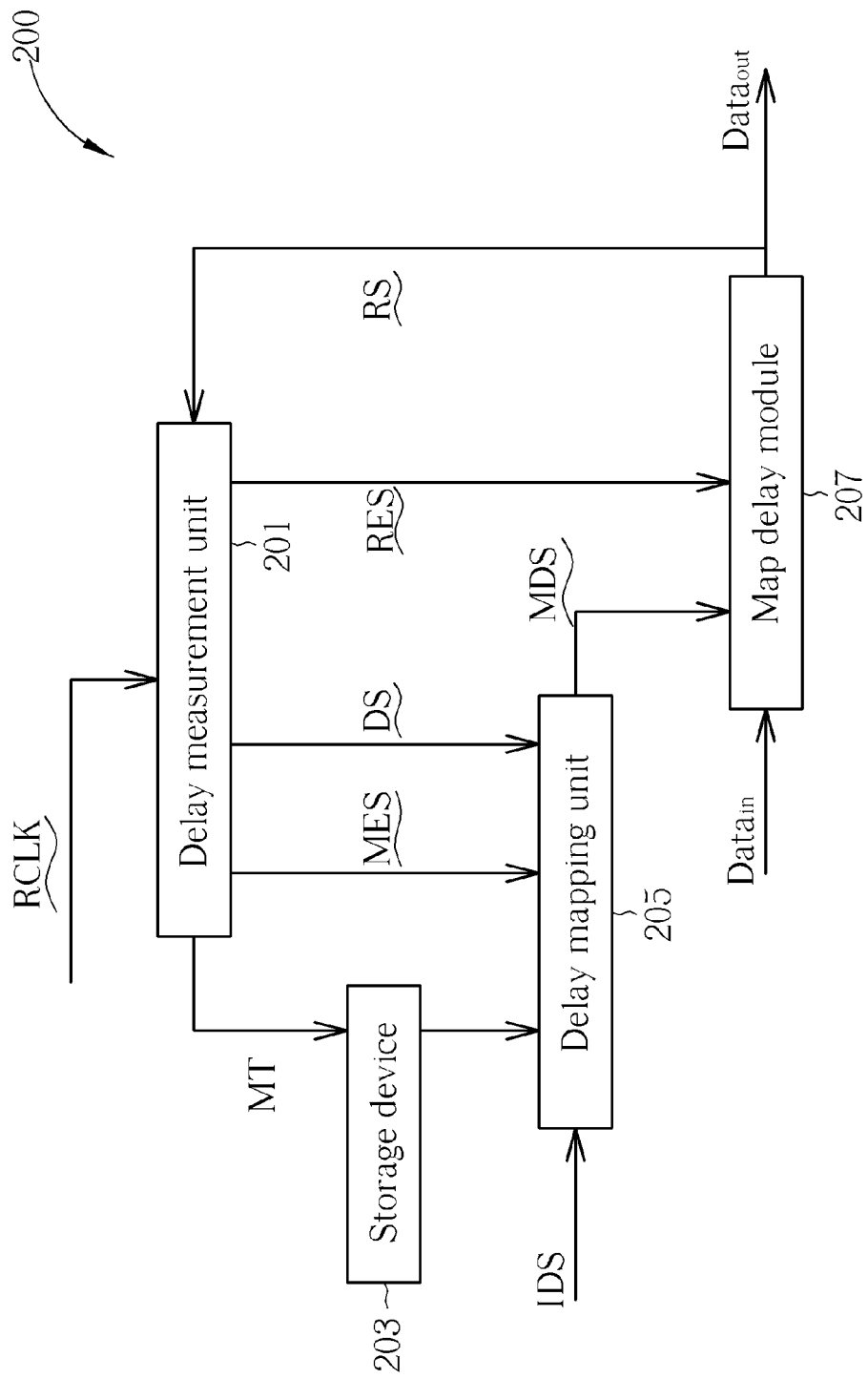
FIG. 2a illustrates a block diagram of a delay circuit according to an embodiment of the present invention.

FIG. 2a illustrates a block diagram of a delay circuit 200 according to an embodiment of the present invention that is used to generate a mapping table and select a proper number of delay stages according to the mapping table. The delay circuit 200 comprises a delay measurement unit 201, a storage device 203, a delay mapping unit 205, and a map delay module 207. The delay measurement unit 201 is utilized for generating a mapping table MT, a map enable signal MES, a ring enable signal RES, and a delay selection signal DS according to a reference signal RS and a reference clock signal RCLK. The storage device 203 (for example, a register or a memory), which is coupled to the delay measurement unit 201, is used for storing the mapping table MT from the delay measurement unit 201. The delay mapping unit 205, which is coupled to the storage device 203 and the delay measurement unit 201, is controlled by the map enable signal MES for generating a mapped selection signal MDS according to the delay selection signal DS in a first mode (mapping table generating mode) and according to an input selection signal IDS and a mapping value of the mapping table in a second mode (normal mode). The map delay module 207, which is coupled to the delay measurement unit 201 and the delay mapping unit 205, is controlled by the ring enable signal RES for generating the reference signal RS corresponding to the mapped selection signal MDS in the first mode and for delaying an input data signal Data$_{in}$ to generate an output data signal Data$_{out}$ corresponding to the mapped selection signal MDS in the second mode.

Briefly, the operation of the delay circuit 200 can be summarized as a method comprising two steps: The first step generates a mapping table according to a reference signal RS from a delay circuit in a first mode. The second step maps an input selection signal IDS to select a proper number of delay stages of the map delay module 207 according to a mapping value of the mapping table MT in the second mode.

Figure 2B:
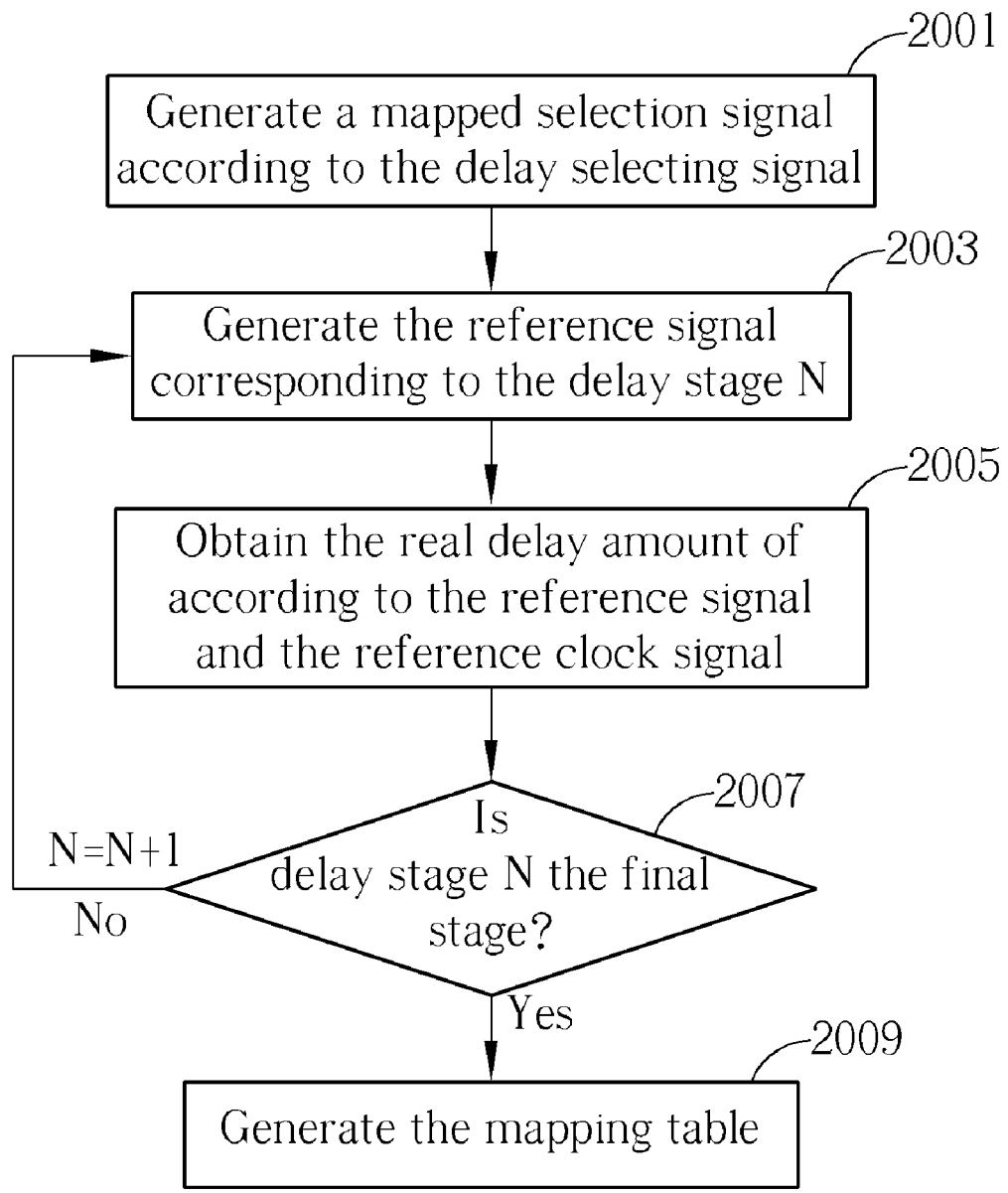
FIG. 2b is a flow chart illustrating the operations of the delay circuit shown in FIG. 2a in a first mode.

FIG. 2b is a flow chart illustrating the operations of the delay circuit 200 in the first mode (mapping table generating mode). The steps are as follows:

Step 2001

The map enable signal MES controls the delay mapping unit 205 to generate a mapped selection signal MDS according to the delay selection signal DS.

In another mode, the input delay selection signal IDS is transformed to the mapped selection signal MDS according to a mapping table MT stored in the storage device 203. Therefore the number of stages selected by the mapped selection signal MDS and the input delay selection signal IDS may be different in another mode. However, in this mode, the number of delay stages selected by the mapped selection signal MDS equals the number of the delay selection signal DS.

Step 2003

The ring enable signal RES controls the map delay module 207 to generate the reference signal RS corresponding to the delay stage N selected by the mapped selection signal MDS.

The reference signal RS, which is a periodical signal in this embodiment, can indicate the real delay amount of each delay stage of the map delay module 207. The detailed structure of the map delay module 207 and how the reference signal RS is generated will be described in the following.

Step 2005

Obtain the real delay amount of the delay stage selected by the delay stage N selected by the mapped selection signal MDS according to the reference signal RS and the reference clock signal RCLK.

Step 2007

Determine if the delay stage N selected by the mapped selection signal MDS is a final delay stage of the delay circuit. If yes, go to step 2009, if not, N=N+1, and return to step 2003.

Step 2009

The delay mapping unit 201 generates the mapping table MT according to the real delay amounts of all delay stages.

In one embodiment, the mapping table MT is generated according to which number of the delay stages has a real delay amount having a minimum difference from the delay amount of the original selected delay stage. For example, if the input delay selection signal IDS selects 3 delay stages having a delay amount of 1 us, and the real delay amount of 3 delay stages is 0.6 us, the real delay amount of 5 delay stages is 1.1 us. The mapping table will then map 3 delay stages to 5 delay stages, i.e. the mapped selection signal MDS will select 5 delay stages instead of 3 stages. It should be noted that such a mechanism is only given as an example and is not meant to limit the scope of the present invention. Other mechanisms based on this concept should also fall within the scope of the present invention. Also, the mapping table MT is generated according to all delay stages of the delay circuit in one embodiment, but the mapping table can also be generated according to only part of the delay stages.

The mapping table MT not only can be generated to indicate the real delay amount of the map delay module 207, but can also be generated to meet different requirements. For example, a delay circuit in the map delay module 207 can be a monotonic delay chain according to the mapping table. Also, the mapping table can make the delay stages of the delay circuit in the map delay module 207 have a minimum delay amount difference with each other. The detailed description of theses examples will be shown in the following.

In the first mode, the control signal MES controls the delay mapping unit 205 to enable the delay selection signal DS to be sent for selecting the number of delay stages of the map delay module 207, such that the map delay module 207 can generate a reference signal RS (a periodical signal in this embodiment, but not limited to being a periodical signal in other embodiments) corresponding to the selected number of delay stages. The reference signal RS can indicate the real delay of the selected number of delay stages. Then the delay measurement unit 201 generates a mapping table MT according to the reference signal RS.

Figure 2C:
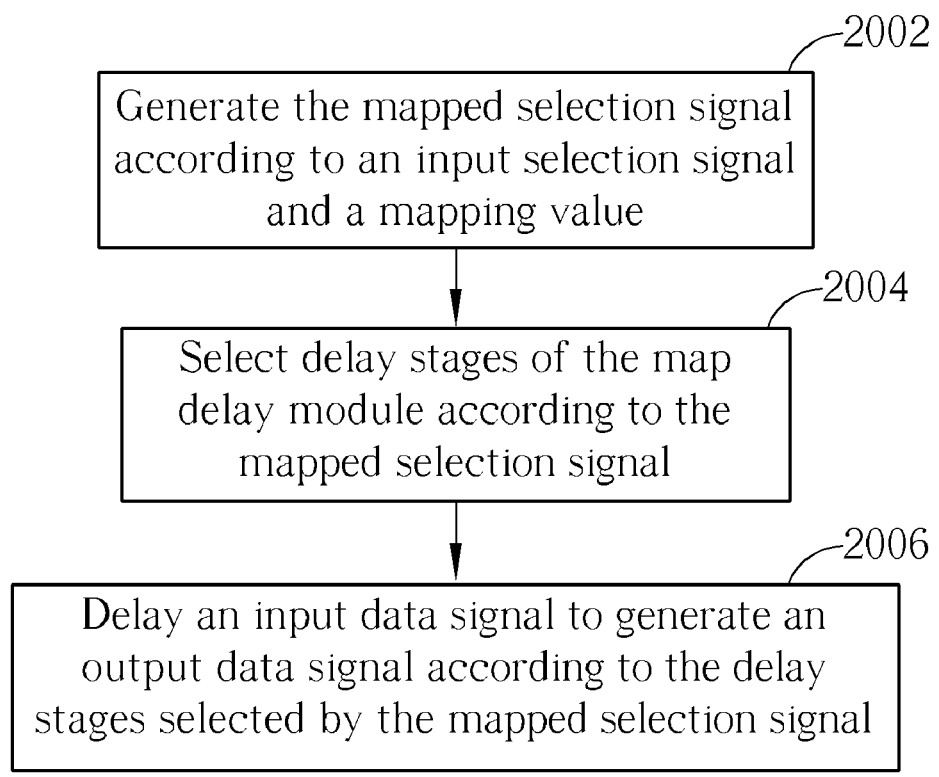
FIG. 2c is a flow chart illustrating the operations of the delay circuit shown in FIG. 2a in a second mode.

FIG. 2c is a flow chart illustrating the operations of the delay circuit 200 in the second mode (normal mode). The steps are as follows:

Step 2002:

The map enable signal MES controls the delay mapping unit 205 to generate the mapped selection signal MDS according to an input selection signal IDS and a mapping value from the mapping table MT stored in the storage device 203.

In this mode, the mapped selection signal MDS relates to the input delay selection signal IDS instead of the delay selection signal DS, and the number of stages selected by the mapped selection signal MDS and the input delay selection signal IDS may be different.

Step 2004

Select delay stages of the map delay module 207 according to the mapped selection signal MDS.

Step 2006:

The ring enable signal RES controls the map delay module 207 to delay an input data signal $Data_{in}$ to generate an output data signal $Data_{out}$ according to the delay stages selected by the mapped selection signal MDS, instead of generating the reference signal RS.

In the second mode, the delay mapping unit 205 maps the input selection signal IDS to a mapped selection signal MDS according to a mapping value of the mapping table MT to select a proper number of delay stages, such that a desired delay amount or a desired delay circuit type can be provided. For example, if the number of the original delay stages selected by the input selection signal IDS is 2 and the mapped delay stage number corresponding to the original delay stage number selected by the mapped selection signal MDS is 3, then the mapping value is 3.

It should be noted that the present invention is not limited to include all the devices disclosed in FIG. 2a. A person skilled in the art can simply implement the delay measurement unit 201 and the map delay module 207 to generate a mapping table. Additionally, the above-mentioned mapping table is not limited to be obtained by the above-mentioned circuit. If at least one specific mapping value is predetermined or a mapping table is obtained by other circuits or programs, the delay mapping unit 205 can be used to map the input data signal IDS to a mapped selection signal MDS to select a proper number of delay stages according to the mapping value.

Figure 3:
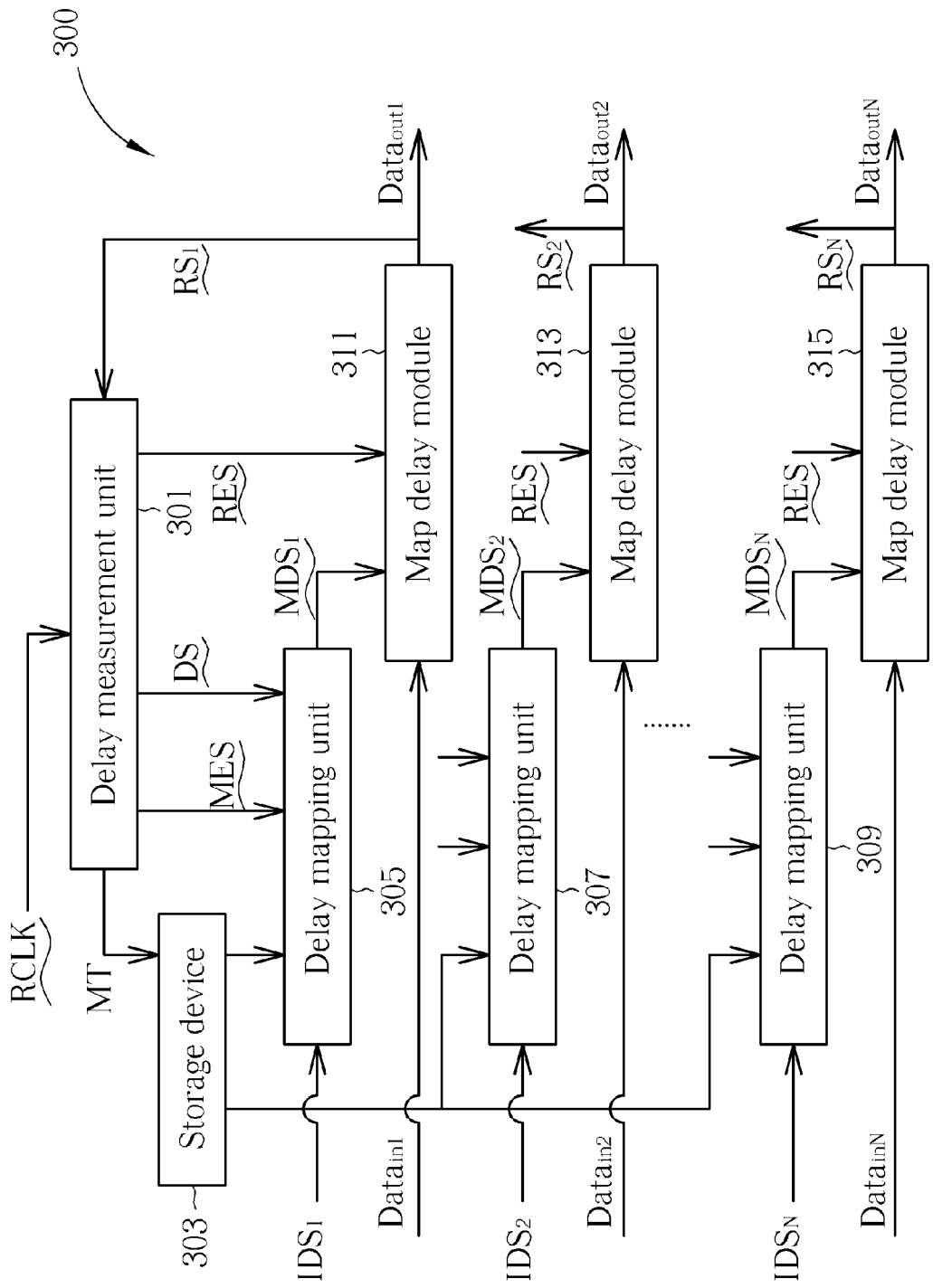
FIG. 3 illustrates a block diagram of a delay circuit comprising more than one delay mapping unit and map delay module according to a second embodiment of the present invention.

Furthermore, the delay circuit 200 is not limited to be applied to a single delay mapping unit. FIG. 3 illustrates a block diagram of a delay circuit 300 comprising more than one delay mapping unit and map delay module according to a second embodiment of the present invention. As shown in FIG. 3, the delay circuit 300 includes more than one delay mapping unit 305, 307, 309 and more than one map delay module 311, 313, 315. The delay mapping units 305, 307, 309 are jointly coupled to the delay measurement unit 301 and the storage device 303 for respectively mapping the input data signal $IDS_1 \sim IDS_n$ to the mapping delay selection signals $MDS_1 \sim MDS_N$ according to the mapping table stored in the storage device 303. The map delay modules 311, 313, 315 are used for delaying input data signals $Data_{in1} \sim Data_{inN}$ according to the mapped selection signals $MDS_1 \sim MDS_N$ to respectively generate output data signals $Data_{out1}$-$Data_{outN}$. If map delay modules 311, 313, 315 have the same characteristics, they can use the same mapping table. Furthermore, if map delay modules 311, 313, 315 have different characteristics, they can respectively generate reference signals $RS_1 \sim RS_N$ to generate different mapping tables, and the delay mapping units 305, 307, 309 can map the input data signal $IDS_1 \sim IDS_n$ to the mapping delay selection signals $MDS_1 \sim MDS_N$ according to different mapping tables.

Figure 4:
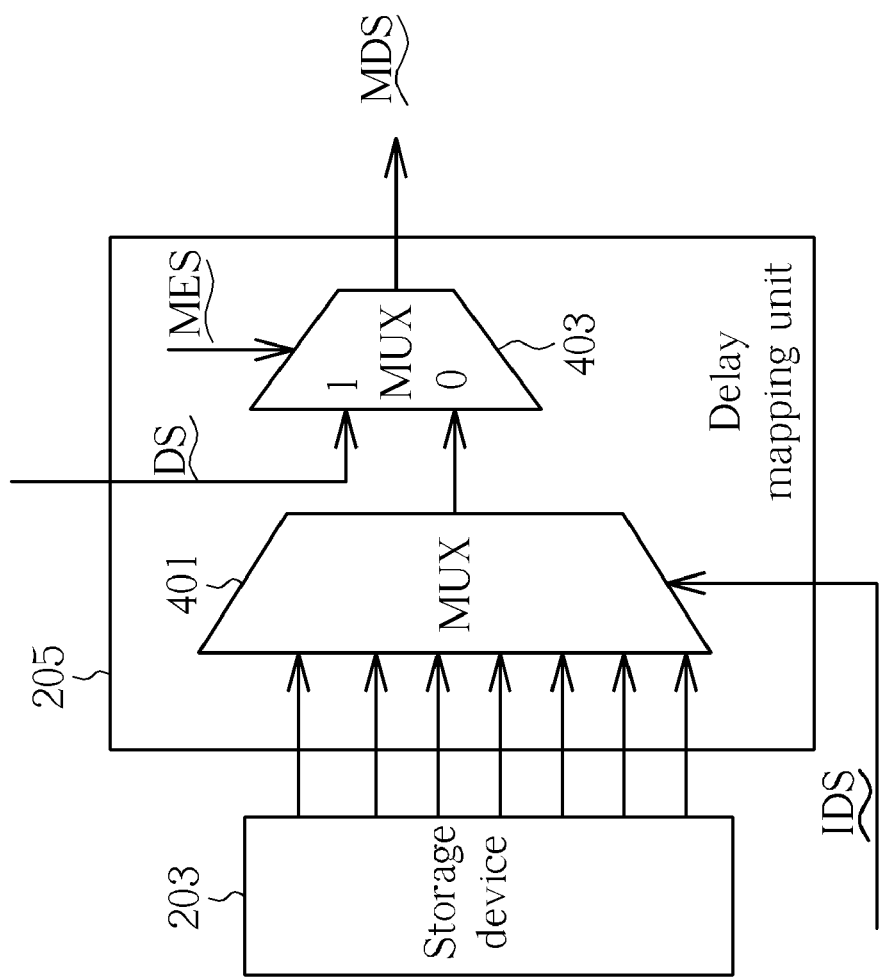

FIG. 4 illustrates a circuit diagram of the detailed structure of the delay mapping unit 205 shown in FIG. 2a. The delay mapping unit 405 includes a first multiplexer 401 and a second multiplexer 403. The first multiplexer 401, which is coupled to the storage device 203, is used for outputting the mapping value from the mapping table stored in the storage device 203 according to the input selection signal IDS. The second multiplexer 403, which is coupled to the first multiplexer 403 and is controlled by the map enable signal MES, is used for outputting the delay selection signal DS as the mapped selection signal MDS in the first mode and for outputting the mapping values as the mapped selection signal MDS in the second mode.

Figure 5:
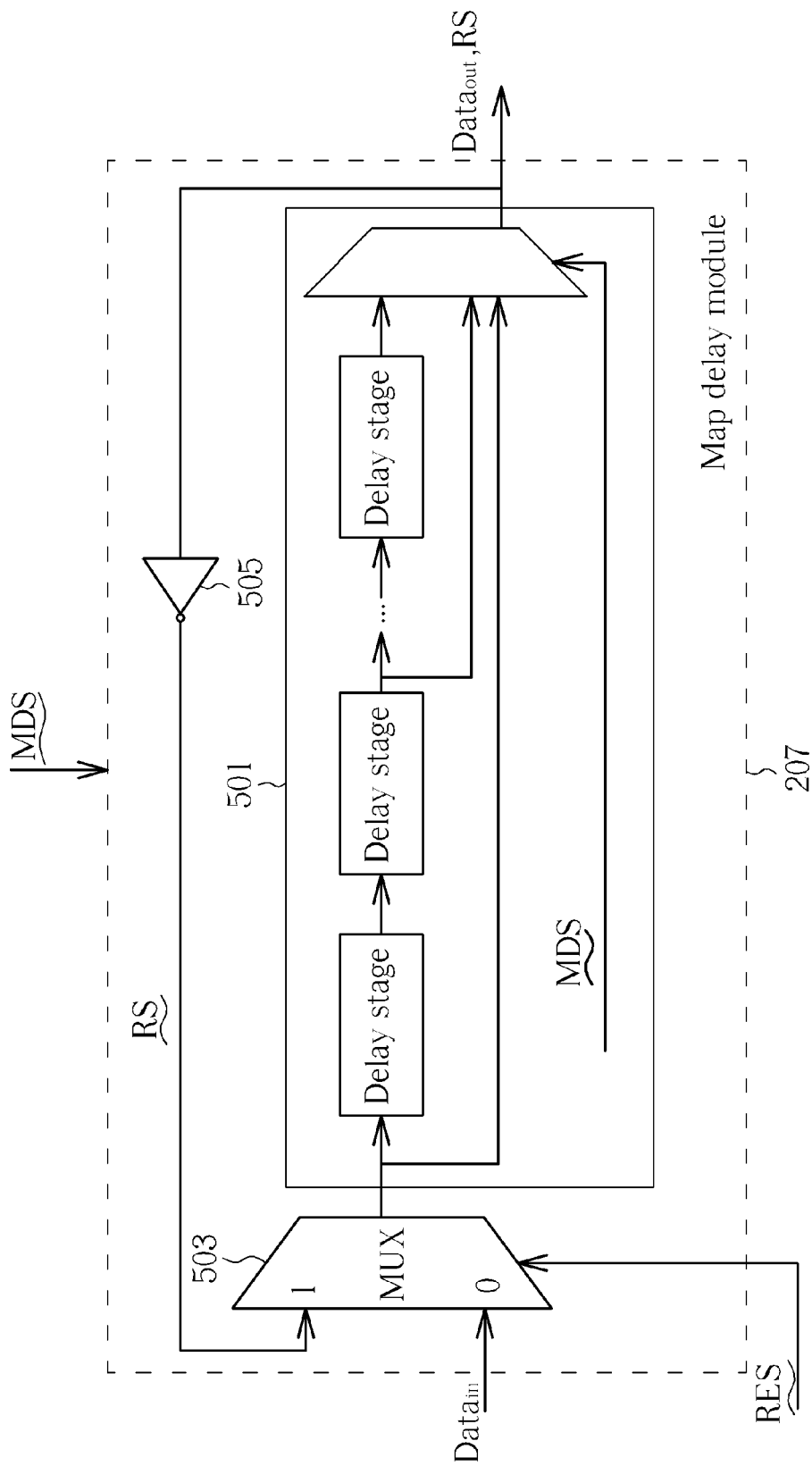

FIG. 5 illustrates a circuit diagram of the map delay module shown in FIG. 2. The map delay module 207 comprises a delay chain 501 and a multiplexer 503, in this embodiment, the reference signal RS is a periodical signal. The multiplexer 503 is used for outputting the reference signal RS in the first mode and outputting the input data signal $Data_{in}$ in the second mode. The delay chain 501, which includes a plurality of delay stages, is used for generating the reference signal RS in the first mode and for generating the output data signal $Data_{out}$ according to the input data signal from the multiplexer 503 and mapped selection signal MDS in the second mode. A proper number of delay stages is selected by the mapped selection signal MDS, and the output data signal $Data_{out}$ and the reference signal RS outputted from the delay chain 501 corresponding to the selected delay stages. In this case, if the mapped delay selection MDS signal selects d delay stages, the period of the reference signal RS is 2 (ti+td), 2ti is the period of the reference signal RS corresponding to no delay stage, and td is the delay corresponding to the selected d delay stages.

It should be noted that, although the map delay module 207 further includes an inverter 505 to match the structure of the delay chain 501 for generating the reference signal RS, the inverter 505 is not an essential component and can be omitted if the structure of the delay circuit is altered.

Figure 6:
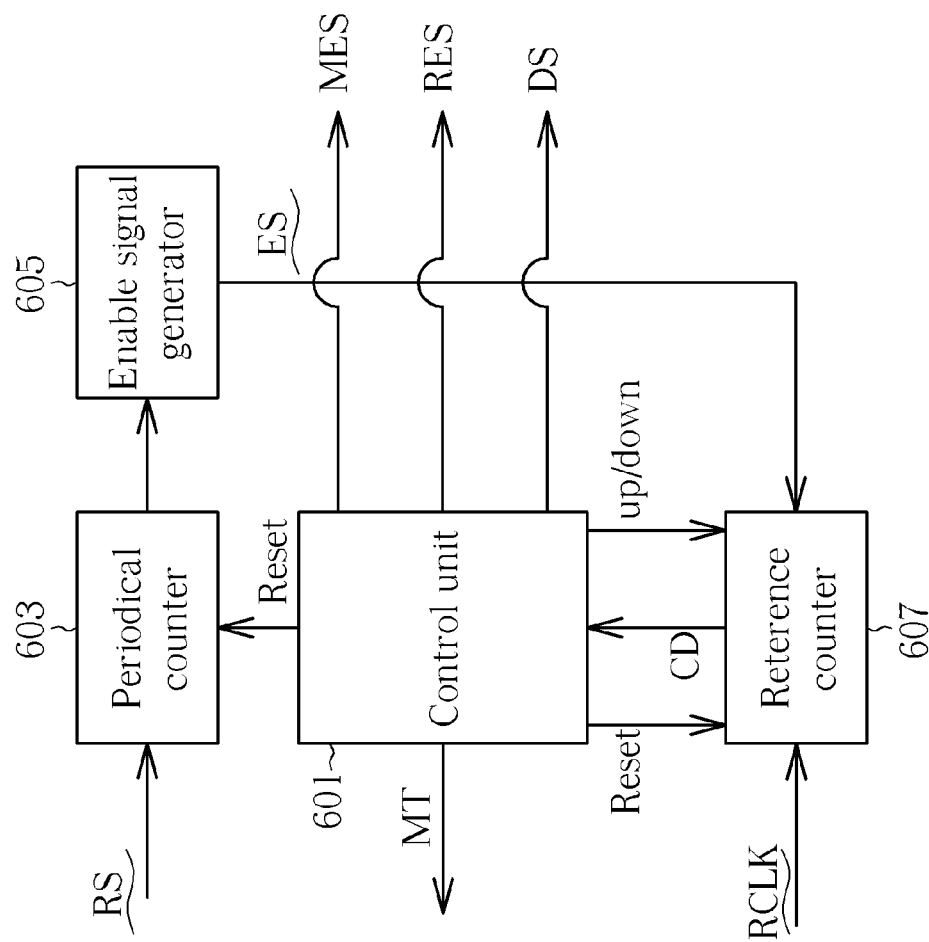

FIG. 6 is a block diagram illustrating detailed structures of the delay measurement unit 201 shown in FIG. 2a. The delay measurement unit 201 comprises a control unit 601, a periodical counter 603, an enable signal generator 605 and a reference counter 607. The periodical counter 603 is used for counting the periodical signal (the reference signal RS) to generate a periodical counter value. The enable signal generator 605, which is coupled to the periodical counter 603, is used for generating an enable signal ES according to the periodical counter value. The reference counter 607, which is controlled by the enable signal ES, is used for counting the reference clock signal RCLK to generate a counter difference value CD between two periodical signals respectively corresponding to two different mapped delay selecting signals MDS. The control unit 601, which is coupled to the periodical counter 603 and the reference counter 607, is for controlling the periodical counter 603 and the reference counter 607 to generate the mapping table MT according to the counter difference value CD, and for generating the map enable signal MES, the ring enable signal RES and the delay selection signal DS.

The periodical counter is reset to a negative value near 0, and the reference counter is set to 0. Then, a selected number of delay stages is selected by the delay selection signal DS, and the mapped delay circuit outputs the periodical signal (the reference signal RS) corresponding to the selected delay stages to the periodical counter 603, such that the periodical counter 603 will increment. The enable signal generator controls the enable signal ES to be 1 for enabling the reference counter 607 to increment when the periodical counter value reaches 0. The enable signal ES is set to 0 to stop the reference counter and the control signal RES is set to 0 when the periodical counter reaches a specific value M. After a period of time, the control unit resets the periodical counter 603 to a negative value near 0, sets the delay selection signal DS as 0 (makes the mapped delay circuit provide a periodical signal with no delay amount), and sets the ring enable signal RES to 1. Then the above-described operation is performed again, but this time the reference counter 607 will decrement.

In this way, the counter difference value CD between the periodical signal corresponding to the selected number of delay stages and the periodical signal corresponding to no delay stage is obtained. If the period of the reference clock signal is tr, the ideal CD is 2td*M/tr. By repeating the above-mentioned operation, all counter difference values CD between the periodical signals corresponding to all the delay stages and the periodical signal corresponding to no delay stage can be obtained. The control unit 601 can then generate a mapping table MT according to the counter difference values CD. It should be noted that, although the counter difference values CD indicate the relations between the delay stages in this embodiment, the delay amount of the delay stages can also be obtained according to the counter difference values CD if the delay amount of delay stages is known.

It should be noted that the devices and the operation shown in FIG. 6 are only given as examples and are not meant to limit the scope of the present invention. For example, the control unit 601 may only receive the reference counter values corresponding to delay stages from the reference counter 607 and transmit them to other devices for calculating the mapping table MT according to the reference counter values. The devices for calculating the mapping table MT can be a microprocessor located outside the delay measurement unit 201 or integrated to the delay measurement unit 201. All such variations fall within the scope of the present invention.

As part or all of the counter difference values CD are obtained, a mapping table MT can be determined according to desired results. Table 1 is an example of a table illustrating the relation between ideal CDs and actual CDs.

TABLE 1

| Number of Delay Stages | 0 | 1 | 2 | 3 | 4 |
|---|---|---|---|---|---|
| Actual CD | 0 | 17 | 52 | 43 | 80 |
| Ideal CD | 0 | 20 | 40 | 60 | 80 |

The order of ideal CDs makes the delay circuit a monotonic delay circuit, but the order of actual CDs does not. Therefore, if the delay circuit is desired to be a monotonic delay circuit, a mapping table shown in Table 2 will be obtained. Although the input selection signal IDS selects 2 delay stages, the mapping value is 3. Similarly, although the input selection signal IDS selects 3 delay stages, the mapping value is 2. In this way, each number of the selected delay stages will have a delay amount having a minimum error from the ideal delay amount. Also, the delay circuit after mapping is a monotonic delay circuit in the embodiment shown in Table 2.

TABLE 2

| IDS | 0 | 1 | 2 | 3 | 4 |
|---|---|---|---|---|---|
| Mapping Value | 0 | 1 | 3 | 2 | 4 |

If the design of the circuit cannot allow all the counter difference values CD to be recorded, each number of selected delay stages is desired to have a delay amount having a minimum error from the ideal delay amount. Other kinds of mapping tables different from the mapping table shown in Table 2 can be generated. For example, only delay stages with a larger actual CD than the ideal CD can be selected as the delay stage for mapping. Table 3 illustrates such a kind of mapping table, which references the relation shown in Table 1. In this case, although the error between the ideal CD and the actual CD is 32, the delay circuit will still be a monotonic delay circuit, and the space for recording the counter difference values can be decreased.

TABLE 3

| IDS | 0 | 1 | 2 | 3 | 4 |
|---|---|---|---|---|---|
| Mapping Value | 0 | 2 | 2 | 4 | 4 |

If the delay chain is a high resolution delay chain, the storage device can only contain a simplified mapping table instead of a mapping table corresponding to all delay stages to save the storage space. Table 4 illustrates relations between ideal CDs and actual CDs for a high resolution delay chain. The delay chain includes 16 delay stages, but the number of the ideal CDs is only 4. Therefore, the actual CD of 1 delay stage is compared with the first ideal CD 20 and the actual CD of 2 delay stages is compared with the first ideal CD 40 etc. A mapping table can then be generated.

TABLE 4

| d | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| Actual CD | 0 | 4 | 12 | 15 | 17 | 21 | 28 | 37 | 34 | 43 | 52 | 61 | 59 | 63 | 68 | 75 | 80 |
| Ideal CD | 0 | | | | 20 | | | | 40 | | | | 60 | | | | 80 |

Table 5 is a mapping table example for a high resolution delay chain corresponding to Table 4. In this case, an original delay stage is mapped to a closest delay stage having an actual CD larger than the ideal counter difference of the original delay stage. The delay circuit is a monotonic delay circuit according to the mapping table shown in Table 5. In this case, the input selection signal IDS is multiplied by a predetermined parameter n (4 in this embodiment) to generate the mapped selection signal MDS for selecting mapped delay stages.

TABLE 5

| IDS | 0 | 1 | 2 | 3 | 4 |
|---|---|---|---|---|---|
| Mapping Value | 0 | 5 | 9 | 11 | 16 |

Figure 8:
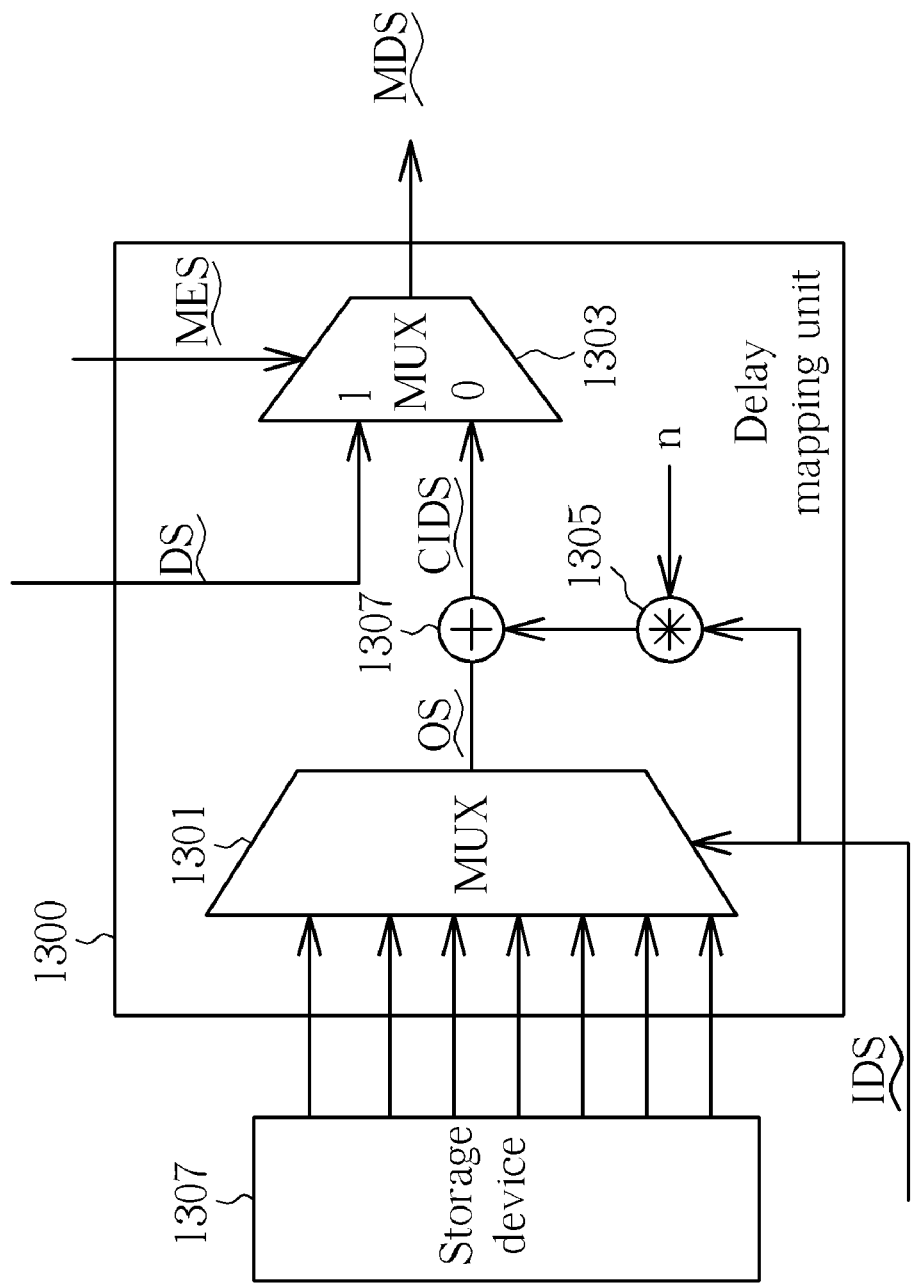
FIG. 8 is a circuit diagram illustrating a delay mapping unit according to one embodiment of the present invention.

FIG. 8 is a delay mapping unit according to one embodiment of the present invention. As shown in FIG. 8, the delay mapping unit comprises: multiplexers 1301, 1303, a multiplier 1305, and an adder 1307. The multiplexer 1301, which is coupled to the storage device 1307, is used for outputting the mapping value from the mapping table and the offset selection signal OS from an offset table stored in the storage device 1307 according to the input selection signal IDS. The multiplexer 1303 is coupled to the adder 1307, for outputting the delay selection signal DS as the mapped selection signal MDS in the first mode and for outputting a combined input selection signal CIDS as the mapped delay selection in the second mode.

The multiplier 1305, which is coupled to the adder 1307, is used for generating the multiplied input selection signal MIDS. The adder 1307 is used for combining the multiplied input selection signal MIDS and the offset delay selection signal OS to generate the combined input selection signal CIDS.

Figure 7:
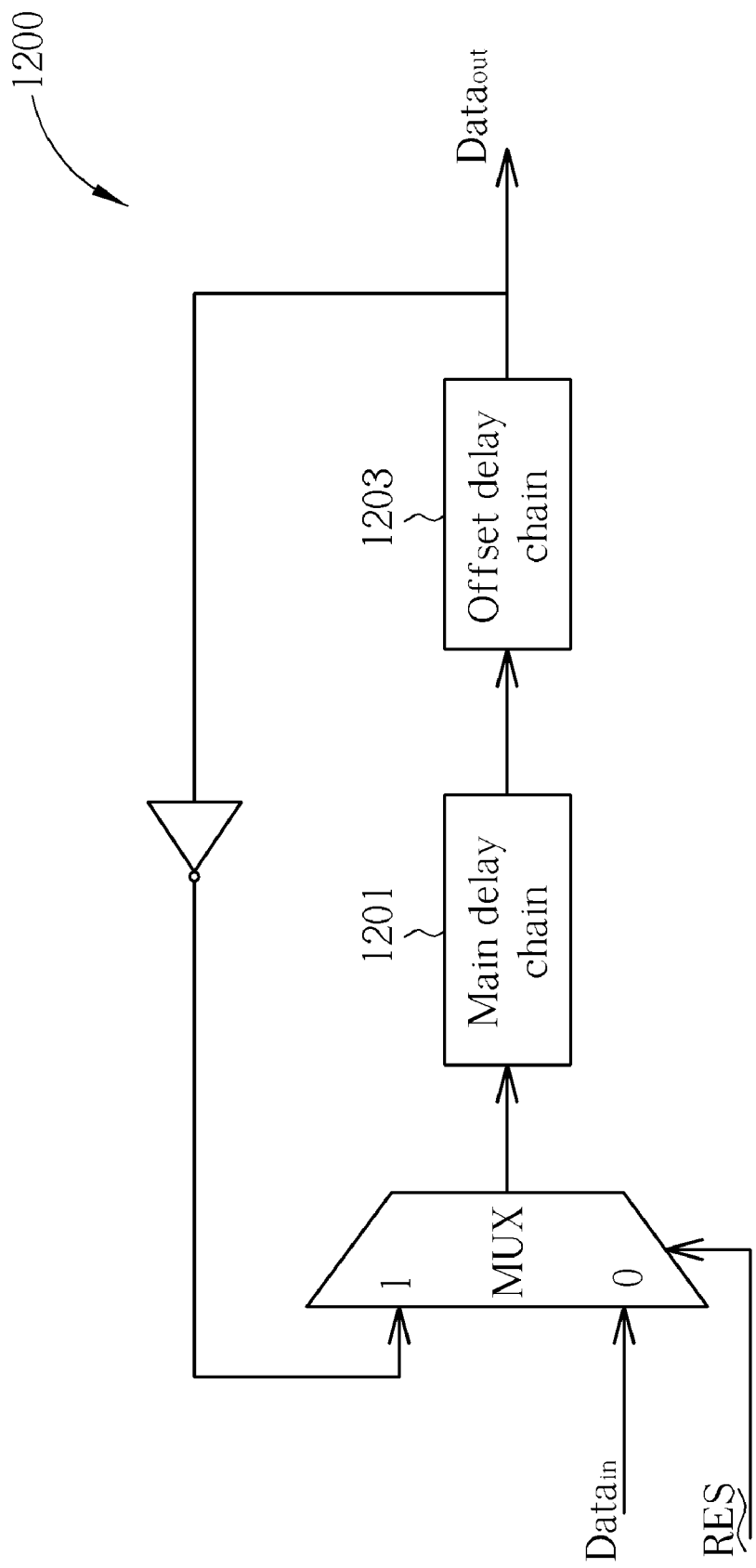
FIG. 7 is a circuit diagram illustrating a delay circuit comprising a main delay chain and an offset delay chain.

Such a mapped delay circuit will have larger errors for delay amounts, however. Therefore, in order to decrease the difference between the original delay stages and mapped delay stages, the delay chain 1200 can comprise a main delay chain 1201 for providing a main delay amount according to the input selection signal IDS, and an offset delay chain to provide an offset delay amount according to an offset selection signal for amending the difference between the actual delay amount and the ideal delay amount, as shown in FIG. 7. Moreover, the delay circuit 1200 shown in FIG. 7 is not limited to be utilized for the high resolution circuit described in Table 4 and Table 5. The main delay chain 1201 can be directly selected by a main delay selection signal, which is equal to the input selection signal IDS, without multiplying the input selection signal IDS by a predetermined parameter n. The offset delay chain 1203 is selected by an offset delay selection signal, which is selected from the offset table stored in the storage device according to the input selection signal IDS. In this way, not only can a monotonic delay circuit be obtained, but the difference between the actual and an ideal delay amount can also be decreased.

The methods corresponding to the above mentioned circuits can be obtained according to the above description, and are therefore omitted for brevity.

According to the above-mentioned circuits and methods, not only can a desired delay amount be obtained by mapping, but a mapping table can also be generated according to the reference signal generated from the delay circuit to be mapped. Also, a monotonic delay circuit can be obtained accordingly. Preferably, the steps of generating the mapping table and selecting desired delay stages by mapping are performed by the same circuit.

The delay amount measured by the above-mentioned mechanism can also be utilized for other applications. For example, after the delay amount is measured, it can be utilized to check if the delay stages in the delay circuit have delay faults or not. FIGS. 9~14 disclose such mechanisms.

Figure 9:
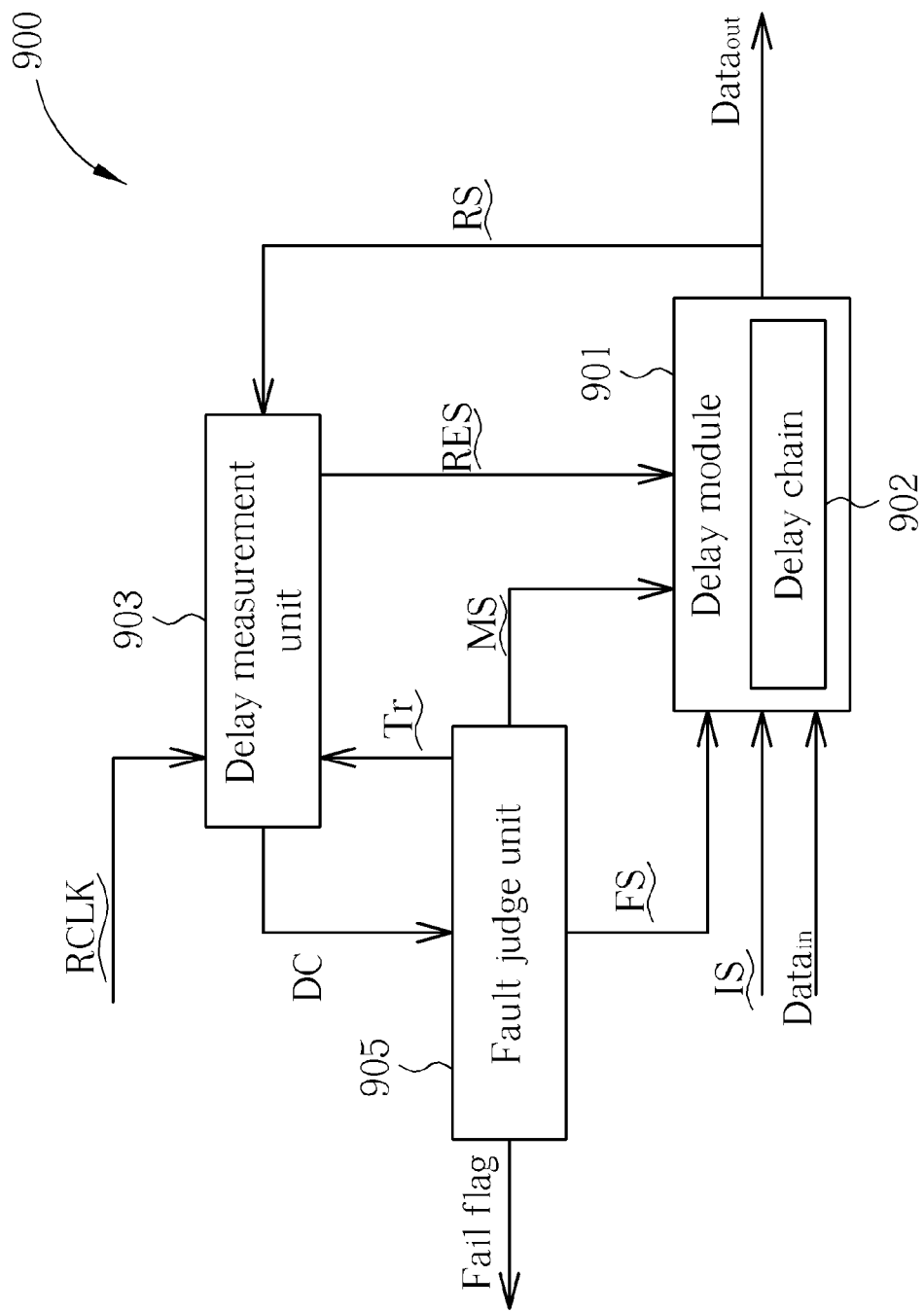
FIG. 9 is a block diagram illustrating a delay circuit, which can detect whether a delay chain has delay faults or not, according to one embodiment of the present invention.

FIG. 9 is a block diagram illustrating a delay circuit 900, which can detect whether a delay chain has delay faults or not, according to one embodiment of the present invention. As shown in FIG. 9, the delay circuit 900 includes a delay module 901, a delay measurement unit 903 and a fault judge unit 905. The delay module 901 has a delay chain 902 with at least one delay stage. The delay measurement unit 903 measures a first delay amount and a second delay amount of the delay module 901 respectively corresponding to a first number and a second number of delay stages. The fault judge unit 905 is used for determining if a delay chain in the delay module 901 has delay faults or not according to the first and second delay amounts.

Specifically, the delay measurement unit 903 generates a delay codes DC, which is indicative of delay amounts corresponding to different delay stage numbers of the delay chain 902, according to the reference clock RCLK and the reference signal RS, which can be a periodical signal. The fault judge unit 905 generates a fail flag indicating if the delay chain 902 has delay faults or not according to the delay code DC. In this embodiment, the delay module 901 outputs the reference signal RS in a fault detecting mode, and delays an input data signal $Data_{in}$ to generate an output data signal $Data_{out}$ in a normal mode. Also, the delay measurement 903 utilizes a ring enable signal RES and the fault judge unit 905 utilizes a mode selection signal MS to jointly control the delay module 901 to output the reference signal RS or the output data $Data_{out}$. A fault selection signal FS is utilized for selecting delay stages in the fault detecting mode, and the delay module 901 outputs reference signals RS corresponding to the selected delay stages. The input selection signal IS is utilized for selecting delay stages in the normal mode, and the delay module 901 outputs output data $Data_{out}$ corresponding to the selected delay stages.

Figure 10:
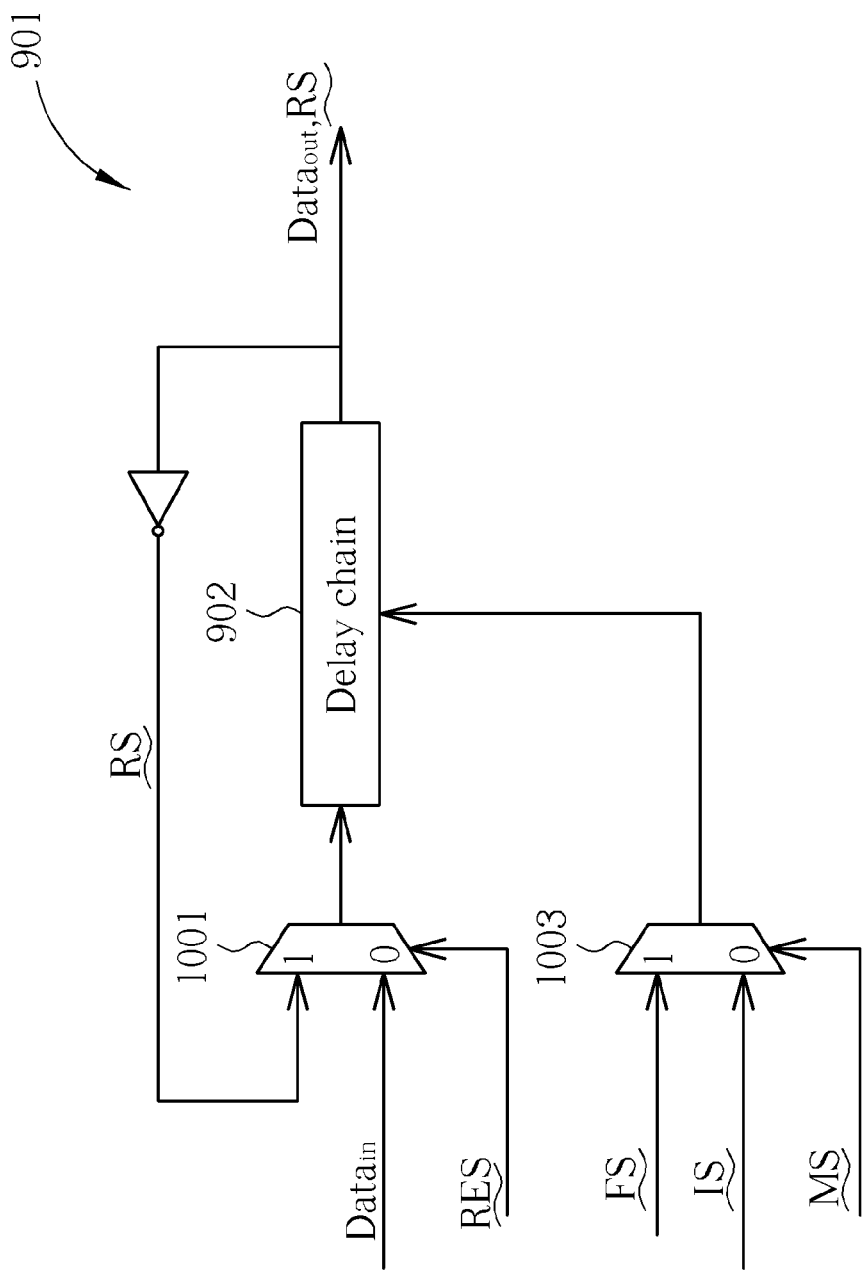
FIG. 10 is an example of the delay module shown in FIG. 9.

FIG. 10 is an example of the delay module 901 shown in FIG. 9. In this example, the reference signal RS is a periodical signal, as described above. As shown in FIG. 10, the delay module 901 includes the delay chain 902, a multiplexer 1001 and a multiplexer 1003. The multiplexer 1001 is controlled by the ring enable signal RES to output the input data signal $Data_{in}$ in the normal mode or the reference signal RS in the fault detecting mode to the delay chain 902. The multiplexer 1003 is controlled by the mode selection signal MS to output the fault selection signal FS in the fault detecting mode or the input selection signal IS in the normal mode to the delay chain 902.

Figure 11:
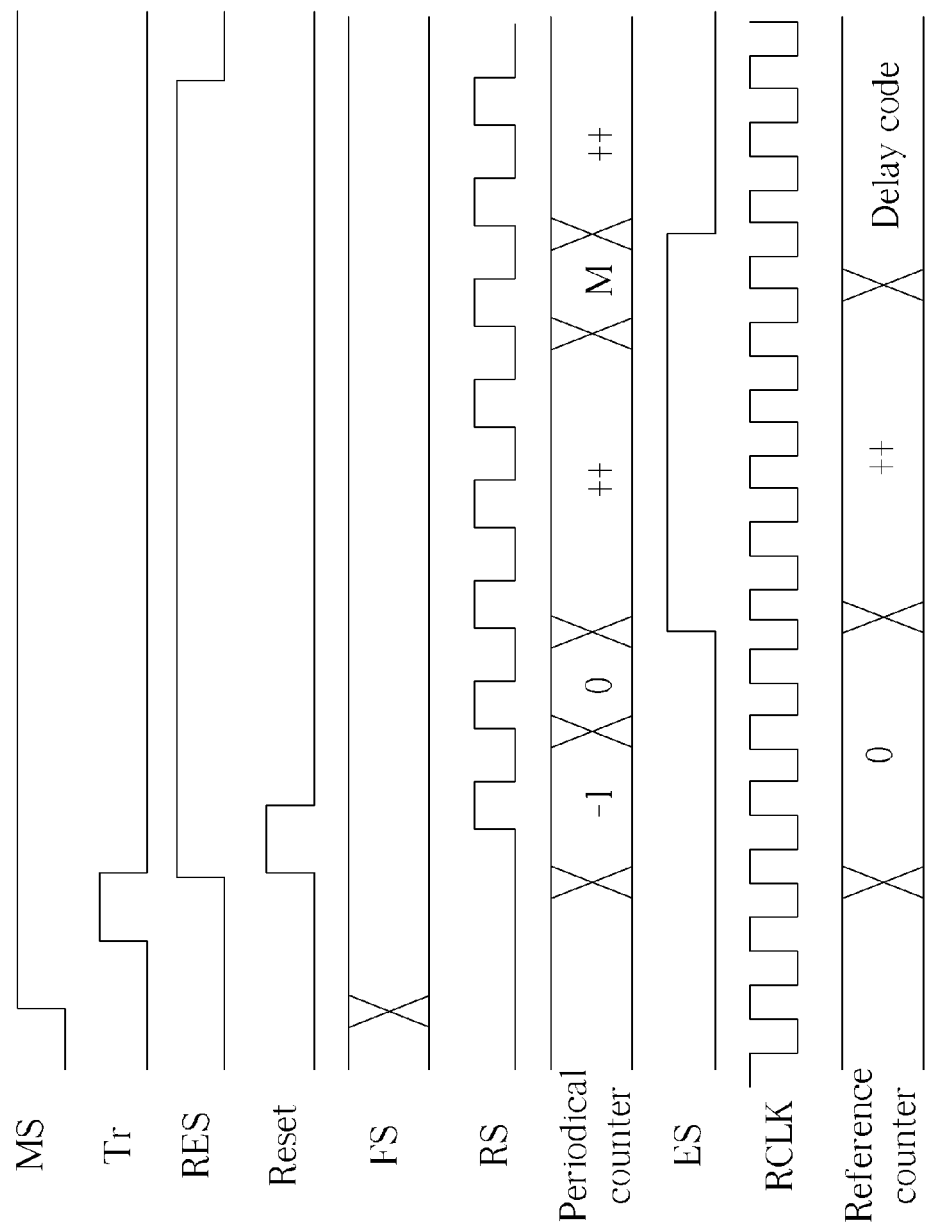
FIG. 11 is a schematic diagram illustrating the operation of the delay measurement unit shown in FIG. 9.

FIG. 11 is a timing diagram illustrating the signal operation of the delay measurement unit of FIG. 6. AS shown in FIG. 11, the reference signal is counted to generate periodical counter values −1~M in the period of the enable signal ES. Also, the reference clock signal RCLK is countered to generate a reference counter value, and the delay code is generated according to the relation between the periodical counter values and the reference counter values. It should be noted that although the periodical counter value starts from −1, it is only for the convenience of computing does not mean to limit the scope of the present invention. The periodical counter value can start from any value.

Figure 12:
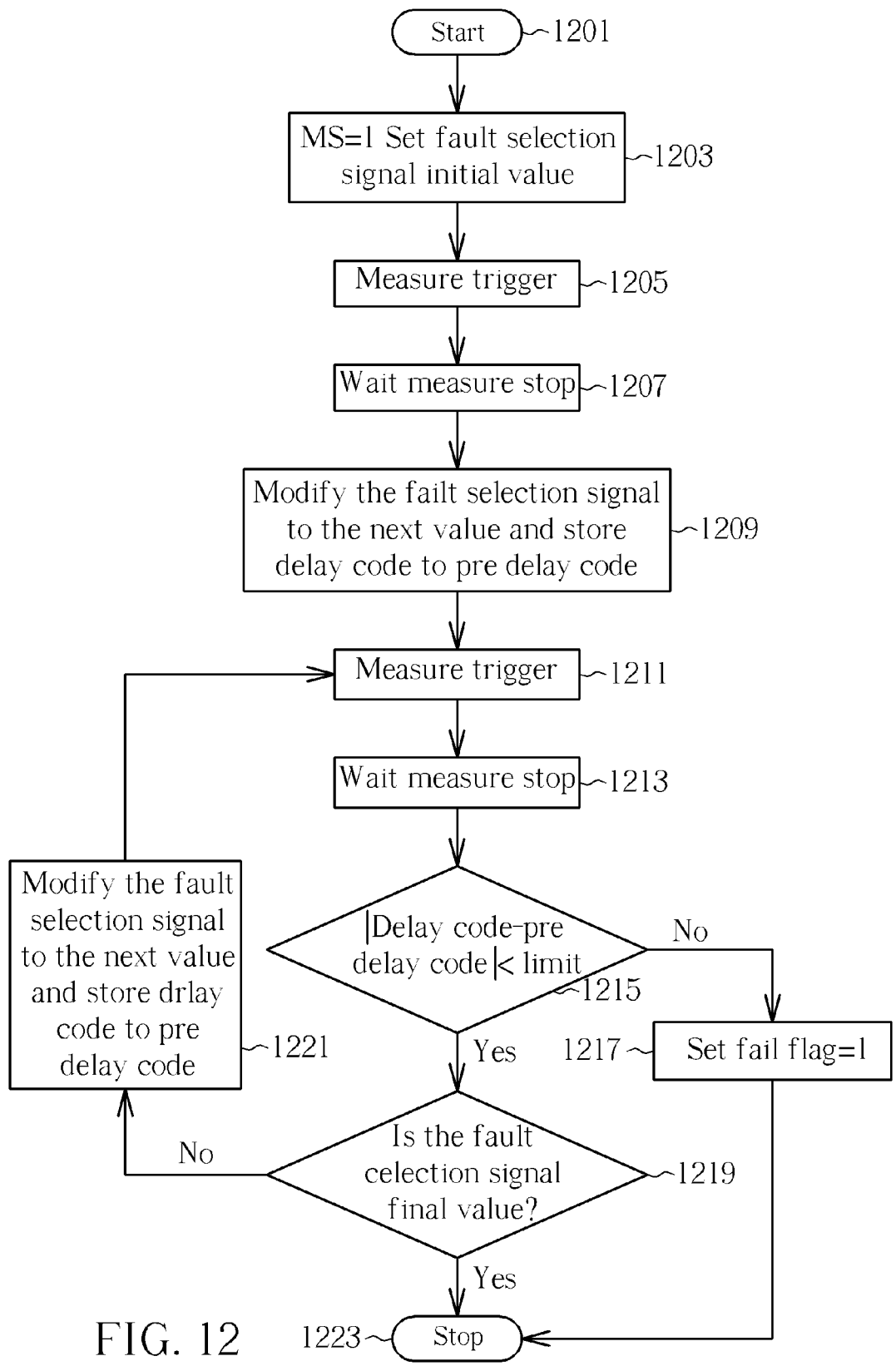
FIG. 12 is a flow chart illustrating the operation of the delay circuit shown in FIG. 9.

FIG. 12 is a flow chart illustrating the operation of the delay circuit shown in FIG. 9. Please jointly refer to FIG. 9 and FIG. 12 to clearly understand the operation of the delay circuit according to the first embodiment of the present invention. It should be noted that the steps shown in FIG. 12 are only given as examples and are not meant to limit the scope of the present invention. As shown in FIG. 12, the steps comprise:

Step 1201

Start

Step 1203

Set mode selection signal MS=1; set fault selection signal FS to an initial value.

Step 1205

Trigger the measurement unit to operate.

Step 1207

Wait for measurement to be completed.

Step 1209

Modify the fault selection signal FS to the next value, i.e. select a next delay stage number which is the current delay stage number plus 1 or plus a predetermined integer other than 1; and store delay code DC to a pre delay code.

Step 1211

Trigger the delay measurement unit to operate.

Step 1213

Wait for measurement to be completed.

Step 1215

Check if a different between the delay code DC and the pre delay code is smaller than a predetermined value. If not, go to step 1217, if yes, go to step 1219.

Step 1217

Set fail flag=1, which indicates the measured delay circuit has delay fault.

Step 1219

Check if the fault selection signal FS is the final value. If not, go to step 1221; if yes, go to step 1223.

Step 1221

Modify the fault selection signal FS to the next value, and store delay code DC to a pre delay code.

Step 1223

End.

Figure 13:
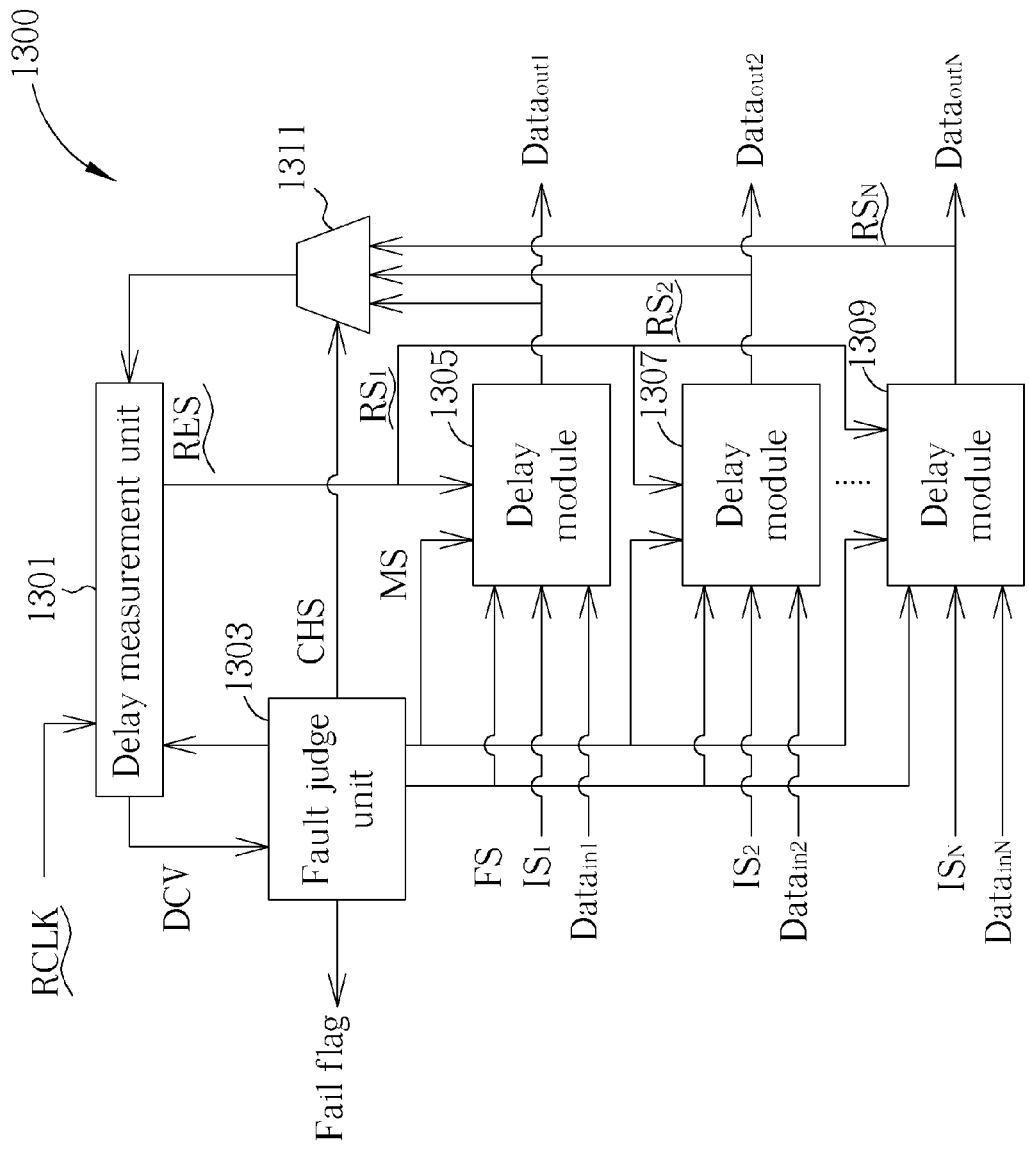
FIG. 13 is a block diagram illustrating a delay circuit, which can detect whether a delay chain has delay faults or not, according to another embodiment of the present invention.

FIG. 13 is a block diagram illustrating a delay circuit according to another embodiment of the present invention, which can detect if any of the delay chains has delay faults or not.

The above-mentioned first embodiment is utilized for detecting if any delay stage in a delay circuit has delay faults, and the present invention further discloses a second embodiment to detect if any of a plurality of delay circuits has delay faults. FIG. 13 is a block diagram illustrating a delay circuit 1300 according to a second embodiment of the present invention. As shown in FIG. 13, the delay circuit 1300 includes a delay measurement unit 1301, a fault judge unit 1303, and a plurality of delay modules 1305, 1307, and 1309. The delay measurement unit 1301 is utilized for measuring delay amounts of the same or different delay stages of the delay modules 1305, 1307, and 1309 to detect if any of the delay modules 1305, 1307, and 1309 has delay faults. In this embodiment, the delay circuit 1300 further includes a multiplexer 1311, and the fault judge unit outputs a channel selection signal CHS to select which one of the delay modules 1305, 1307, and 1309 can output related signals such as reference signals $RS_1$, $RS_2$ and $RS_N$ or the output data signals $Data_{out1}$, $Data_{out2}$, $Data_{out3}$.

Figure 14:
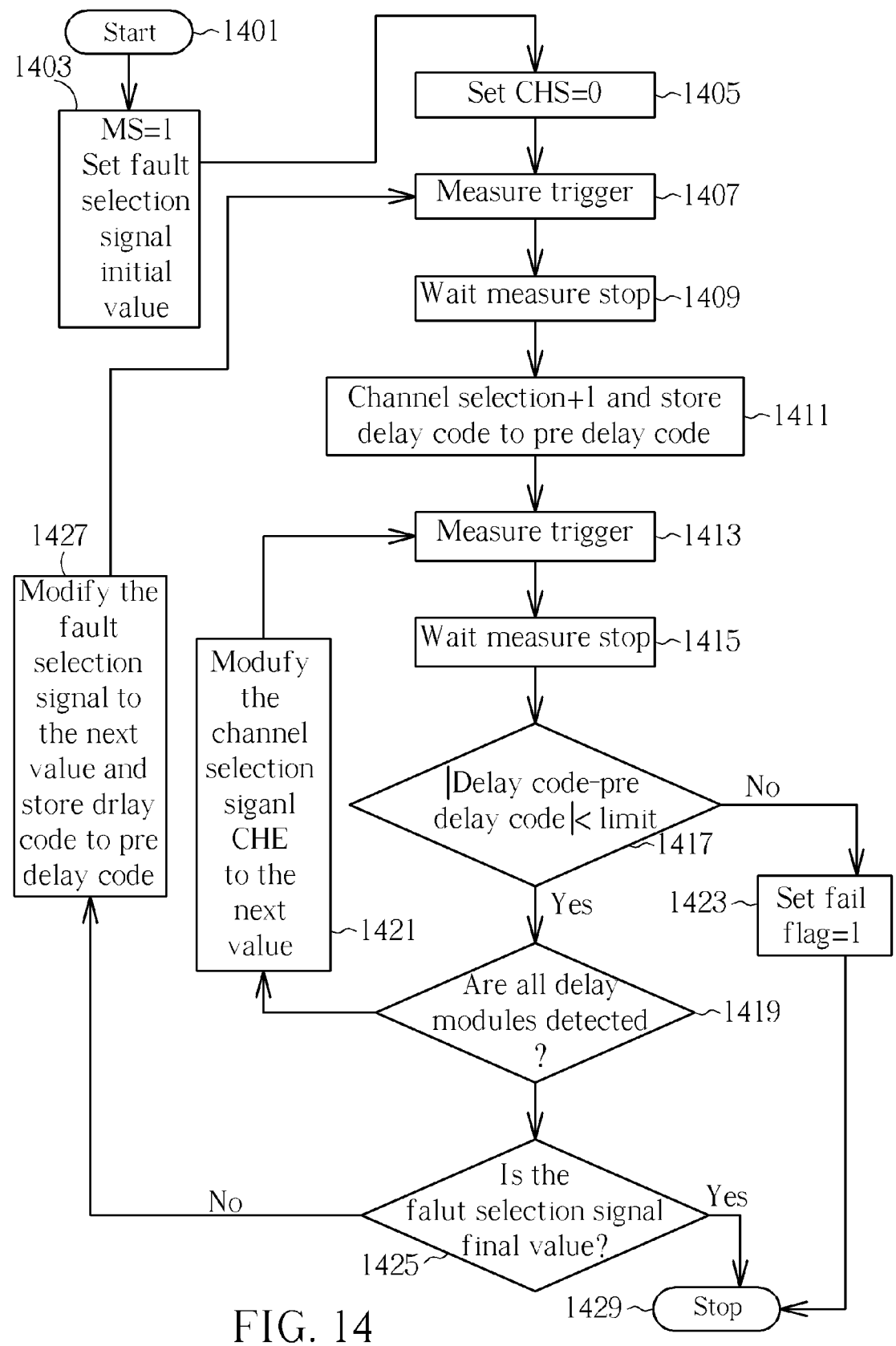
FIG. 14 is a flow chart illustrating the operation of the delay circuit shown in FIG. 13.

FIG. 14 is a flow chart diagram illustrating the operation of the delay circuit 1300 shown in FIG. 13. Please jointly refer to FIG. 13 and FIG. 14 to clearly understand the operation of the delay circuit according to the second embodiment of the present invention. It should be noted that the steps shown in FIG. 14 are only examples and are not meant to limit the scope of the present invention. As shown in FIG. 14, the steps comprise:

Step 1401

Start

Step 1403

Set mode selection signal MS=1; set fault selection signal FS to an initial value.

Step 1405

Set channel selection signal CHS=0

Step 1407

Trigger the measurement unit to operate.

Step 1409

Wait for measurement to be completed.

Step 1411

Modify the channel selection signal CHS to the next value (plus 1 or plus a predetermined integer other than 1), that is, select a next delay module different from the current delay module; and store delay code DC to a pre delay code.

Step 1413

Trigger the delay measurement unit to operate.

Step 1415

Wait measurement to be completed.

Step 1417

Check if a difference between the delay code DC and the pre delay code is smaller than a predetermined value. If not, go to step 1423, if yes, go to step 1419.

Step 1419

Are all delay modules detected?

Step 1421

Modify the channel selection signal CHE to the next value (plus 1 or plus a predetermined value other than 1)

Step 1423

Set fail flag=1, which indicates the measured delay circuit has delay fault, and go to step 1429.

Step 1425

Check if the fault selection signal FS is the final value. If not, go to step 1427; if yes, go to step 1429.

Step 1427

Modify the fault selection signal FS to the next value (plus 1 or plus a predetermined integer other than 1), and set channel selection signal CHS=0.

Step 1429

End.

Briefly, the delay circuit 1300 measures delay amount of the delay stages with the same delay stage number (for example, 3 delay stages) of each delay module and determine if any one of the delay modules has delay faults according to the measurement result, i.e. the delay code DC. If no delay fault is found, the delay amounts of the delay stages with a next delay stage number (for example, 4 delay stages) are measured and it is determined if any one of the delay modules has delay faults according to the measurement result. Such steps will be repeated until a delay fault is found or until all delay stages are measured. The above-described operation is not meant to limit the scope of the present invention, however. The delay measurement unit 1301 can measure delay stages with different delay stage numbers of the delay modules. For example, the delay measurement unit 1301 can measure 3 delay stages of the delay module 1305 and 4 delay stages of the delay module 1307 and see if two delay amounts have a difference that is greater than a predetermined value to determine if any one of the delay modules 1305 and 1307 has delay fault.

According to the above-mentioned circuits, the delay stage can be detected if it has delay faults or not via detecting the delay amount thereof, thus the problems of the related art can be avoided. Also, the delay circuit according to the present invention can be utilized as a normal delay circuit, thus the application thereof can be extended.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay circuit, comprising:
   a first delay module, having a first delay chain with at least one delay stage;

a delay measurement unit, coupled to the first delay module, for measuring a first delay amount and a second delay amount of the first delay chain respectively corresponding to a first number and a second number of delay stages; and a fault judge unit, coupled to the delay measurement unit, for determining if the first delay chain has delay faults or not according to the first and second delay amounts.

2. The delay circuit of claim 1, wherein the delay measurement unit measures the first delay amount and second delay amount of the first delay chain according to periodical signals from the first delay module, where the periodical signals correspond to a first delay stage number and a second delay stage number.

3. The delay circuit of claim 2, wherein the first delay chain outputs the periodical signals in a fault detecting mode, and delays an input signal to generate an output signal in a normal mode.

4. The delay circuit of claim 3, wherein the fault judge unit is coupled to the first delay module and outputs a selecting signal to select a delay stage number corresponding to one of the periodical signals in the normal mode, where the fault judge unit and the delay measurement unit jointly control which one of the fault detecting mode and the normal mode the first delay module operates in.

5. The delay circuit of claim 4, wherein the delay measurement unit comprises:
   a periodical counter, for counting one of the periodical signals to generate a periodical counter value;
   an enable signal generator, coupled to the periodical counter, for generating an enable signal according to the periodical counter value;
   a reference counter, coupled to the enable signal generator, for counting a reference clock signal according to the enable signal and the periodical signal to generate a delay code indicative of the first or second delay amount; and
   a control unit, coupled to the periodical counter and the reference counter, for controlling the periodical counter and the reference counter, and for controlling the first delay module to output the periodical signals or not.

6. The delay circuit of claim 1, wherein the delay circuit further includes a second delay module having a second delay chain with at least one delay stage, the delay measurement unit further measures a third delay amount of the first delay chain and a fourth delay amount of the second delay chain, and the fault judge unit further determines if the first delay chain or the second delay chain has delay faults or not according to the third and fourth delay amounts.

7. The delay circuit of claim 6, wherein the third and fourth delay amounts correspond to an identical delay stage number of the first delay chain and the second delay chain.

8. A delay circuit, comprising:
   a first delay module, having a first delay chain with at least one delay stage;
   a second delay module, having a second delay chain with at least one delay stage;
   a delay measurement unit, coupled to the first and the second delay chains, for measuring a first delay amount of the first delay chain and a second delay amount of the second delay chain; and
   a fault judge unit, coupled to the delay measurement unit, for determining if the first delay chain or the second delay chain has delay faults or not according to the first and second delay amounts.

9. The delay circuit of claim 8, wherein the first and second delay amounts correspond to an identical delay stage number of the first delay chain and the second delay chain.

10. The delay circuit of claim 8, wherein the fault judge unit measures the first delay amount and second delay amount according to periodical signals from the first delay module and the second delay module, where the periodical signals correspond to a first delay stage number and a second delay stage number.

11. The delay circuit of claim 10, wherein the first delay module and the second delay module output the periodical signals in a fault detecting mode, and delay an input signal to generate an output signal in a normal mode.

12. The delay circuit of claim 11, wherein the fault judge unit is coupled to the first delay module and the second delay module, and outputs selecting signals to select delay stage numbers respectively corresponding to the periodical signals in the fault detecting mode, where the fault judge unit and the delay measurement unit jointly control which one of the fault detecting mode and the normal mode the first delay module or the second delay module operate in.

13. The delay circuit of claim 10, wherein the delay measurement unit comprises:
   a periodical counter, for counting one of the periodical signals to generate a periodical counter value;
   an enable signal generator, coupled to the periodical counter, for generating an enable signal according to the periodical counter value;
   a reference counter, coupled to the enable signal generator, for counting a reference clock signal according to the enable signal and the periodical signal to generate a delay code indicative of the first or second delay amount; and
   a control unit, coupled to the periodical counter and the reference counter, for controlling the periodical counter and the reference counter, and for controlling the first or the second delay module to output the periodical signals or not.

14. A delay method, comprising:
   (a) measuring a first delay amount and a second delay amount of a first delay chain respectively corresponding to a first number and a second number of delay stages; and
   (b) determining if the first delay chain has delay faults or not according to the first and second delay amounts.

15. The delay method of claim 14, wherein the step (a) measures the first delay amount and second delay amount of the first delay chain according to periodical signals from the first delay chain, where the periodical signals correspond to a first delay stage number and a second delay stage number.

16. The delay method of claim 15, further comprising controlling the first delay chain to output the periodical signal in a fault detecting mode, and to delay an input signal to generate an output signal in a normal mode.

17. The delay method of claim 15, wherein the delay measurement unit comprises:
   counting at least one periodical signal to generate a periodical counter value;
   generating an enable signal according to the periodical counter value; and
   counting a reference clock signal according to the enable signal and the periodical signal to generate a counter value indicative of the first or second delay amount.

18. The delay method of claim 14, further providing a second delay chain, wherein the step (a) further measures a third delay amount of the first delay chain and a fourth delay amount of the second delay chain, and the step (b) further determines if the first delay chain or the second delay chain has delay faults or not according to the third and fourth delay amounts.

19. The delay method of claim 18, wherein the third and fourth delay amounts correspond to an identical delay stage number of the first delay chain and the second delay chain.

20. A delay method, comprising:
   (a) measuring a first delay amount of the first delay chain and a second delay amount of a second delay chain; and
   (b) determining if the first delay chain or the second delay chain has delay faults or not according to the first and second delay amounts.

21. The delay method of claim 20, wherein the first and second delay amounts correspond to an identical delay stage number of the first delay chain and the second delay chain.

22. The delay method of claim 20, wherein the step (b) measures the first delay amount and second delay amount according to periodical signals from the first delay chain and the second delay chain, where the periodical signals correspond to a first delay stage number and a second delay stage number.

23. The delay method of claim 22, further controlling the first delay chain and the second delay chain to respectively output the periodical signal in a fault detecting mode, and to delay an input signal to generate an output signal in a normal mode.

24. The delay method of claim 23, wherein the step (b) comprises:
   counting one of the periodical signals to generate a periodical counter value;
   generating an enable signal according to the periodical counter value; and
   counting a reference clock signal according to the enable signal and the periodical signal to generate a counter value indicative of the first or second delay amount.

* * * * *